US010615316B2

(12) United States Patent
Murphy et al.

(10) Patent No.: US 10,615,316 B2
(45) Date of Patent: Apr. 7, 2020

(54) MANGANESE-DOPED PHOSPHOR MATERIALS FOR HIGH POWER DENSITY APPLICATIONS

(71) Applicant: CURRENT LIGHTING SOLUTIONS, LLC, East Cleveland, OH (US)

(72) Inventors: James Edward Murphy, Niskayuna, NY (US); Sam Joseph Camardello, Ballston Spa, NY (US)

(73) Assignee: CURRENT LIGHTING SOLUTIONS, LLC, East Cleveland, OH (US)

( * ) Notice: Subject to any disclaimer, the term of this patent is extended or adjusted under 35 U.S.C. 154(b) by 0 days.

(21) Appl. No.: 15/743,435

(22) PCT Filed: May 9, 2017

(86) PCT No.: PCT/US2017/031654
§ 371 (c)(1),
(2) Date: Jan. 10, 2018

(87) PCT Pub. No.: WO2017/196779
PCT Pub. Date: Nov. 16, 2017

(65) Prior Publication Data
US 2019/0074412 A1 Mar. 7, 2019

Related U.S. Application Data
(60) Provisional application No. 62/333,477, filed on May 9, 2016.

(51) Int. Cl.
*H01L 33/50* (2010.01)
*C09K 11/61* (2006.01)
(Continued)

(52) U.S. Cl.
CPC .......... *H01L 33/502* (2013.01); *C09K 11/616* (2013.01); *C09K 11/617* (2013.01);
(Continued)

(58) Field of Classification Search
CPC .............................. C09K 11/616; C09K 11/57
See application file for complete search history.

(56) References Cited

U.S. PATENT DOCUMENTS

| 6,995,374 B2 | 2/2006 | Lefaucheur et al. |
| 7,361,938 B2 | 4/2008 | Mueller et al. |

(Continued)

FOREIGN PATENT DOCUMENTS

| CN | 204696126 U | 10/2015 | |
| WO | WO-2013138347 A1 * | 9/2013 | ........... C09K 11/576 |
| WO | 2015112939 A1 | 7/2015 | |

OTHER PUBLICATIONS

Delimarskii et al., "Fusibility Diagrams of the Potassium Fluorosilicatepotassium and Sodium Halides Systems", Ukrainskii Khimicheskii Zhurnal, vol. 33, No. 7, 1967,pp. 675-679.
(Continued)

Primary Examiner — Raj R Gupta
(74) Attorney, Agent, or Firm — Buckley, Maschoff & Talwalkar LLC

(57) ABSTRACT

A lighting apparatus is presented. The lighting apparatus includes a semiconductor light source capable of producing blue light of high power density, the semiconductor light source radiationally coupled to a phosphor of formula I in a monolithic form selected from single crystal and ceramic, $A_x(M, Mn)F_y$ (I) where A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of an $[MF_y]$ ion; and y is 5, 6, or 7.

7 Claims, 2 Drawing Sheets

(51) Int. Cl.
*H01L 33/62* (2010.01)
*B60Q 1/04* (2006.01)
*F21V 8/00* (2006.01)

(52) U.S. Cl.
CPC ............... *H01L 33/62* (2013.01); *B60Q 1/04* (2013.01); *G02B 6/0073* (2013.01)

(56) References Cited

U.S. PATENT DOCUMENTS

| | | | |
|---|---|---|---|
| 8,101,443 B2 | 1/2012 | Chakraborty | |
| 8,252,613 B1 | 8/2012 | Lyons et al. | |
| 8,298,442 B2 | 10/2012 | Miyagawa et al. | |
| 8,491,816 B2 | 7/2013 | Hong et al. | |
| 2012/0199858 A1* | 8/2012 | Fujii | H01L 33/507 257/98 |
| 2014/0376205 A1* | 12/2014 | Takizawa | H01S 5/005 362/84 |
| 2015/0076406 A1* | 3/2015 | Zhou | C09K 11/576 252/301.4 F |
| 2015/0198303 A1 | 7/2015 | Park et al. | |

OTHER PUBLICATIONS

Engel et al., "Reference-based optical characterization of glass-ceramic converter for high-power white LEDs", LED Modeling: Phosphors, vol. 6486, Feb. 13, 2007, 10 pages.

Oyama et al., "Unique light-induced degradation in yellow-emitting K2SiF6:Mn2+ phosphor", Journal of Applied Physics, vol. 116, Issue: 13, 2014, 8 Pages.

Wang et al., "Blue-Emitting Sr3Si8—xAlxO7+xN8—x:Eu2+ Discovered by a Single-Particle-Diagnosis Approach: Crystal Structure, Luminescence, Scale-Up Synthesis, and Its Abnormal Thermal Quenching Behavior", Chemistry of Materials, vol. 27, Issue: 22, 2015, pp. 7689-7697.

Song et al.,"High power laser-driven ceramic phosphor plate for outstanding efficient white light conversion in application of automotive lighting", Scientific Reports, Aug. 9, 2016, www.nature.com/scientificreports/, 7 Pages.

* cited by examiner

MANGANESE-DOPED PHOSPHOR MATERIALS FOR HIGH POWER DENSITY APPLICATIONS

CROSS-REFERENCE TO RELATED APPLICATIONS

This application relates to, and claims priority from a provisional U.S. patent application Ser. No. 62/333,477, entitled "MANGANESE-DOPED PHOSPHOR MATERIALS FOR HIGH POWER DENSITY APPLICATIONS", filed on May 9, 2016, which application is hereby incorporated by reference.

BACKGROUND

Light emitting devices such as light emitting diodes (LEDs) and laser diodes (LDs) are well known solid state lighting elements capable of generating light upon application of a sufficient voltage. These light emitting devices are commonly used in various lighting and illuminating applications such as general lighting, automotive lighting, displays, and projection applications.

It is often desirable to incorporate phosphor into these light emitting devices to enhance the emitted radiation in a particular wavelength region and/or to convert at least some of radiation to another wavelength region. Generally, white light can be generated with blue-emitting devices and one or more of yellow, red, and green emitting phosphors. For example, red-emitting phosphors based on complex fluoride materials activated by manganese ($Mn^{4+}$), such as those described in U.S. Pat. Nos. 7,358,542, 7,497,973, and 7,648,649, can be utilized in combination with yellow/green emitting phosphors such as YAG:Ce or other garnet compositions with a blue-emitting device, to achieve warm white light (CCTs<5000 K on the blackbody locus, color rendering index (CRI>80).

Typically, phosphor materials in particulate form are dispersed in a resin such as silicone to form a layer for use in lighting devices. However, such conventional phosphor materials (in layers) may exhibit low thermal conductivities and thermal quenching (a decrease in internal quantum efficiency with temperature). It has been challenging using conventional phosphor materials in high power density lighting devices because the phosphor materials may deteriorate and damage (for example, decompose) under high power density light. For example, as the power density of excitation light increases, the heat generated by the device increases that is detrimental for the phosphor materials. The use of conventional phosphor materials in such high power density lighting devices limits the applicable device power and performance.

Therefore, there remains a need for phosphor materials that facilitate the manufacturing of high power density lighting devices that include phosphor materials, and provide improved performance.

BRIEF DESCRIPTION

Briefly, in one aspect, a lighting apparatus includes a semiconductor light source capable of producing blue light of high power density, the semiconductor light source radiationally coupled to a phosphor of formula I in a monolithic form selected from single crystal and ceramic, $$A_x(M,Mn)F_y \quad (I)$$

wherein A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of an [$MF_y$] ion; and y is 5, 6, or 7.

In one aspect, a backlight apparatus includes a semiconductor light source capable of producing blue light of high power density, the semiconductor light source radiationally coupled to a phosphor of formula I in a monolithic form selected from single crystal and ceramic.

In one aspect, a lighting apparatus includes a semiconductor light source capable of producing blue light of high power density, the semiconductor light source radiationally coupled to a phosphor wheel including a phosphor of formula I in a composite form.

In one aspect, a backlight apparatus includes a semiconductor light source capable of producing blue light of high power density, the semiconductor light source radiationally coupled to a phosphor wheel including a phosphor of formula I in a composite form.

DRAWINGS

These and other features, aspects, and advantages of the present invention will become better understood when the following detailed description is read with reference to the accompanying drawing in which like characters represent like parts throughout the drawings, wherein.

DETAILED DESCRIPTION

Figure 1:
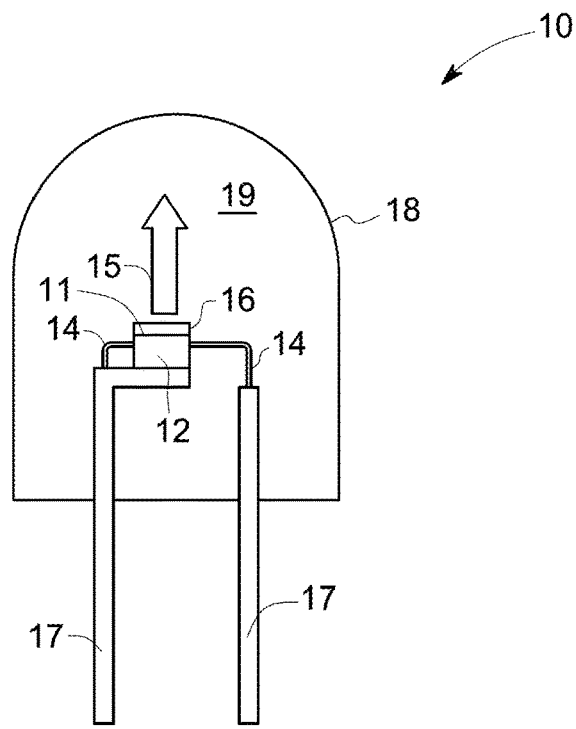
FIG. 1 is a schematic cross-sectional view of a lighting apparatus, in accordance with some embodiments of the present disclosure.

In the following specification and the claims, the singular forms "a", "an" and "the" include plural referents unless the context clearly dictates otherwise. As used herein, the term "or" is not meant to be exclusive and refers to at least one of the referenced components being present and includes instances in which a combination of the referenced components may be present, unless the context clearly dictates otherwise.

Approximating language, as used herein throughout the specification and claims, may be applied to modify any quantitative representation that could permissibly vary without resulting in a change in the basic function to which it is related. Accordingly, a value modified by a term or terms, such as "about" and "substantially" is not limited to the precise value specified. In some instances, the approximating language may correspond to the precision of an instrument for measuring the value.

As used herein, the terms "phosphor", "phosphor composition", and "phosphor material" may be used to denote both a single phosphor as well as blends of two or more phosphors.

As used herein, the term "disposed on" refers to layers or materials disposed directly in contact with each other or indirectly by having intervening layers or features there between, unless otherwise specifically indicated.

As used herein, the term "monolithic form" refers to a single crystal or a single block or piece of a material. In some embodiments, a phosphor of formula I in a monolithic form includes a single block or piece formed of sintered particles stuck together to form a rigid agglomerate of particle of the phosphor of formula I. The term "phosphor of formula I in a monolithic form" may also be referred to as "monolithic form" or "monolith" of the phosphor of formula I, and these terms are used interchangeably throughout the specification.

Some embodiments are directed to a lighting apparatus that includes a semiconductor light source capable of producing blue light of high power density that is radiationally coupled to a phosphor of formula I in a monolithic form selected from single crystal and ceramic. The semiconductor light source may be a light-emitting diode (LED), a laser diode (LD) or a hybrid of LED and LD. In some embodiments, a blue light flux of the semiconductor light source is higher than 25 W/cm$^2$. In some embodiments, a blue light flux of the semiconductor light source is higher than 40 W/cm$^2$. Radiationally coupled means that radiation from the semiconductor light source is transmitted to the phosphor of formula I that emits radiation of a different wavelength. A combination of the light from the semiconductor light source and the light emitted from the phosphor of formula I may be used to produce a desired color emission or white light. The phosphor of formula I in the monolithic form may be disposed on the semiconductor light source or located remotely from the semiconductor light source. In some embodiments, the monolithic form of the phosphor of formula I is a single crystal. In some embodiments, the monolithic form of the phosphor of formula I is a ceramic.

FIG. 1 illustrates a lighting apparatus 10 according to some embodiments of the present disclosure. The lighting apparatus 10 includes a light emitting diode (LED) chip 12, and leads 14 electrically attached to the LED chip 12. The leads 14 may be thin wires supported by a thicker lead frame(s) 17 or the leads may be self-supported electrodes and the lead frame may be omitted. The leads 14 provide current to LED chip 12 and thus cause it to emit radiation. The LED chip 12 may be based on any organic or inorganic semiconductor, for example a semiconductor of formula In$_i$Ga$_j$Al$_k$N (where $0 \leq i$; $0 \leq j$; $0 \leq k$ and $i+j+k=1$) having an emission wavelength greater than about 420 nanometers (nm) and less than about 480 nm. More particularly, the LED chip 12 may be a blue emitting LED having a peak emission wavelength from about 440 nm to about 460 nm. In the lighting apparatus 10, a monolith 16 that includes the monolithic form of the phosphor of formula I, is disposed on a surface 11 of the LED chip 12 i.e., radiationally coupled to the LED chip 12. The monolith of the phosphor of formula I can be disposed on the LED 12 by placing or gluing the monolith 16 to the surface 11 of the LED chip 12. The light emitted by the LED chip 12 mixes with the light emitted by the monolith 16 to produce desired emission (indicated by arrow 15).

With continued reference to FIG. 1, the LED chip 12 may be encapsulated within an envelope 18, which encloses the LED chip 12 and an encapsulant material disposed in a portion 19 of the lighting apparatus 10. The envelope 18 may be, for example, glass or plastic. The LED chip 12 may be enclosed by the encapsulant material. The encapsulant material may be a low temperature glass, or a polymer or resin known in the art, for example, an epoxy, silicone, epoxy-silicone, acrylate or a combination thereof. In an alternative embodiment, the lighting apparatus 10 may only include the encapsulant material without the outer envelope 18.

In some other embodiments, the monolith 16 may be disposed onto a surface of the envelope 18, instead of being disposed on the LED chip 12. Moreover, in some embodiments, the lighting apparatus 10 may include a plurality of LED chips. These various structures discussed with respect to FIG. 1 may be combined, with the monolith 16 located in any one or more locations or in any other suitable location, such as separately from the envelope 18 or integrated into the LED chip 12. Further, one or more additional luminescent materials (described below) such as phosphors or mixtures of phosphors or other materials, may be used in different parts of the lighting apparatus 10, for example disposed on or below the monolith 16 or any other location in the lighting apparatus 10.

Figure 2:
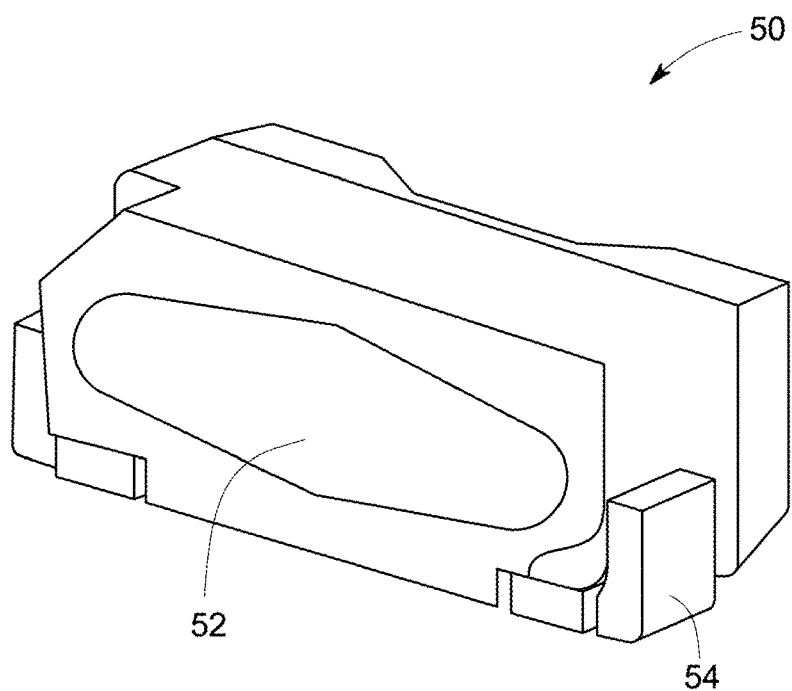
FIG. 2 is a schematic perspective view of a surface-mounted device (SMD), in accordance with some embodiments of the present disclosure.

Some embodiments include a backlight apparatus that includes a surface mounted device (SMD) type light emitting diode 50, e.g. as illustrated in FIG. 2. This SMD is a "side-emitting type" and has a light-emitting window 52 on a protruding portion of a light guiding member 54. An SMD package may comprise an LED chip as defined above, and a phosphor of formula I in a monolithic form as described above.

The phosphor of formula I is a manganese (Mn$^{4+}$) doped complex fluoride. Complex fluorides have a host lattice containing one coordination center, surrounded by fluoride ions acting as ligands, and charge-compensated by counter ions (A) as required. For example, in K$_2$[SiF$_6$], the coordination center is Si and the counter ion is K. Complex fluorides are generally represented as a combination of simple, binary fluorides. The square brackets in the chemical formula for the complex fluorides (occasionally omitted for simplicity) indicate that the complex ion present in that particular complex fluoride is a new chemical species, different from the simple fluoride ion. In the phosphor of formula I, the Mn$^{4+}$ dopant or activator acts as an additional coordination center, substituting a part of the coordination center, for example, Si, forming a luminescent center. The manganese doped phosphor of formula I: A$_2$[(M, Mn)F$_6$] may also be represented as A$_2$[MF$_6$]:Mn$^{4+}$. The host lattice (including the counter ions) may further modify the excitation and emission properties of the activator ion.

The counter ion A in formula I is Li, Na, K, Rb, Cs, or a combination thereof, and y is 6. In certain embodiments, A is Na, K, Rb, or a combination thereof. The coordination center M in formula I is an element selected from the group consisting of Si, Ge, Ti, Zr, Hf, Sn, Al, Ga, In, Sc, Y, Bi, La, Gd, Nb, Ta, and combinations thereof. In certain embodiments, M is Si, Ge, Ti, or a combination thereof. In some embodiments, A is K and M is Si. Examples of the phosphors of formula I include K$_2$[SiF$_6$]:Mn$^{4+}$, K$_2$[TiF$_6$]:Mn$^{4+}$, K$_2$[SnF$_6$]:Mn$^{4+}$, Cs$_2$[TiF$_6$]:Mn$^{4+}$, Rb$_2$[TiF$_6$]:Mn$^{4+}$, Cs$_2$[SiF$_6$]:Mn$^{4+}$, Rb$_2$[SiF$_6$]:Mn$^{4+}$, Na$_2$[TiF$_6$]:Mn$^{4+}$, Na$_2$[ZrF$_6$]:Mn$^{4+}$, K$_3$[ZrF$_7$]:Mn$^{4+}$, K$_3$[BiF$_6$]:Mn$^{4+}$, K$_3$[YF$_6$]:Mn$^{4+}$, K$_3$[LaF$_6$]:Mn$^{4+}$, K$_3$[GdF$_6$]:Mn$^{4+}$, K$_2$[NbF$_7$]:Mn$^{4+}$ and K$_2$[TaF$_7$]:Mn$^{4+}$. In certain embodiments, the phosphor of formula I is K$_2$[SiF$_6$]:Mn$^{4+}$.

Other manganese doped phosphors that may be used in a lighting apparatus as described herein include:
 (A) A$_2$[MF$_5$]:Mn$^{4+}$, where A is selected from Li, Na, K, Rb, Cs, and combinations thereof; and where M is selected from Al, Ga, In, and combinations thereof;
 (B) A$_3$[MF$_6$]:Mn$^{4+}$, where A is selected from Li, Na, K, Rb, Cs, and combinations thereof; and where M is selected from Al, Ga, In, and combinations thereof;
 (C) Zn$_2$[MF$_7$]:Mn$^{4+}$, where M is selected from Al, Ga, In, and combinations thereof;

(D) A[In$_2$F$_7$]:Mn$^{4+}$ where A is selected from Li, Na, K, Rb, Cs, and combinations thereof;

(E) E[MF$_6$]:Mn$^{4+}$, where E is selected from Mg, Ca, Sr, Ba, Zn, and combinations thereof; and where M is selected from Ge, Si, Sn, Ti, Zr, and combinations thereof;

(F) Ba$_{0.65}$Zr$_{0.35}$F$_{2.70}$:Mn$^{4+}$; and (G) A$_3$[ZrF$_7$]:Mn$^{4+}$ where A is selected from Li, Na, K, Rb, Cs, and combinations thereof.

The amount of manganese in the phosphor of formula I as described herein, may range from about 1.2 mol percent (mol %) (about 0.3 weight percent (wt %)) to about 16.5 mol % (about 4 wt %). In some embodiments, the amount of manganese may range from about 2 mol % (about 0.5 wt %) to 13.4 mol % (about 3.3 wt %), or from about 2 mol % to 12.2 mol % (about 3 wt %), or from about 2 mol % to 11.2 mol % (about 2.76 wt %), or or from about 2 mol % to about 10 mol % (about 2.5 wt %), or from about 2 mol % to 5.5 mol % (about 1.4 wt %), or from about 2 mol % to about 3.0 mol % (about 0.75 wt %).

In some embodiments, the monolithic form of the phosphor of formula I includes a single crystal. That is, the monolithic form includes the phosphor of formula I in single crystal form. A single crystal may be formed by combining the phosphor of formula I in powder form and a flux material, firing the combination at a temperature above a eutectic temperature of the combination to form a melt, and cooling the melt to form the phosphor of formula I in the single crystal form. The flux material may be a fluoride, chloride or bromide of Na, K, Rb, Cs, or a combination thereof. Examples of suitable flux materials include KF, KHF$_2$, KCl, KBr, NaF, RbF, RbHF$_2$, CsF, CsHF$_2$, and combinations thereof.

Another method for forming a single crystal form of the phosphor of formula I includes combining a compound of formula II, a source of manganese and the flux material, firing the combination at a temperature above a eutectic temperature of the combination to form a melt, and cooling the melt to form the phosphor of formula I in single crystal form,

$$A_xMF_y \quad (II)$$

wherein A is Li, Na, K, Rb, Cs or a combination thereof, M is Si, Ge, Sn, Ti, Zr, Al, Ga, In, Sc, Hf, Y, La, Nb, Ta, Bi, Gd or a combination thereof, x is an absolute value of a charge of an [MF$_y$] ion; and y is 5, 6, or 7.

In some embodiments, in the compound of formula II, A includes K, Na or a combination thereof and M includes Si, Ge, Ti or a combination thereof. In certain embodiments, A is K and M is Si. Suitable examples of the compounds of formula II include, but are not limited to, K$_2$SiF$_6$, K$_2$TiF$_6$, K$_2$ZrF$_6$, K$_2$SnF$_6$, K$_3$ZrF$_7$, K$_3$LnF$_6$, K$_3$YF$_6$, K$_2$NbF$_7$, K$_2$TaF$_7$, Na$_2$SiF$_6$, Na$_2$TiF$_6$, Na$_2$SnF$_6$, Na$_2$ZrF$_6$, LiKSiF$_6$, RbKLiAlF$_6$ or a combination thereof. In certain embodiments, the compound of formula II is K$_2$SiF$_6$. The source of manganese may include a compound selected from the group consisting of MnF$_2$, MnF$_3$, MnF$_4$, K$_2$MnF$_4$, KMnF$_4$, K$_2$MnF$_6$, K$_2$MnF$_6$, K$_3$Mn$_2$F$_7$, K$_3$MnF$_4$, K$_2$MnF$_5$ and combinations thereof.

The amount of flux material should be such as that suppresses the decomposition of the compound of formula II, for example decomposition of K$_2$SiF$_6$ into 2KF and SiF$_4$. In some embodiments, the amount of the flux material is in a range from about 30 mol % to about 70 mol % in the combination. The firing of the combination may be carried out at a temperature above the eutectic temperature of the combination in an inert or oxidizing atmosphere. In some embodiments, the firing temperature is a temperature higher than 650 degrees Celsius for example, in a range from about 650 degrees Celsius to the melting point of the combination. On firing, the combination melts and a melt is obtained thereby. The melt is then cooled to grow a single crystal. The cooling may be carried out at a slow cooling rate (for example, <10 degrees/hour) to grow a single crystal. A single crystal ingot of the phosphor of formula I may be obtained thereby. The single crystal ingot can be cut in a desired shape and size for example, a plate or disc-shaped single crystal to be used as the monolith 16 (FIG. 1).

In some embodiments, the monolithic form of the phosphor of formula I includes ceramic i.e., a sintered ceramic form of the phosphor of formula I. A sintered ceramic is generally obtained by forming a greenbody including powder(s) of one or more desired ceramic constituents, and then sinter the greenbody until the surface of the ceramic particles begin to soften and melt. The partially melted particles stick together to form a rigid agglomerate of particles i.e., a strong and dense sintered ceramic. A greenbody is an object whose main constituent is weakly bound ceramic material, usually in the form of bonded powder before it has been sintered or fired.

In some embodiments, the sintered ceramic is formed by making a greenbody including the phosphor of formula I and annealing the greenbody at a temperature up to the melting temperature of the phosphor of formula I or the eutectic temperature of a combination of materials used to make the greenbody. In some embodiments, a flux material as described above may be added to the phosphor of formula I to form a greenbody. In some embodiments, the greenbody is annealed at a temperature in a range from about 600 degrees Celsius to about the melting point of the combination.

In some embodiments, the sintered ceramic is formed by combining the powders of the compound of formula II, the source of manganese and the flux material, forming a greenbody of the combination and annealing the greenbody at a temperature up to the eutectic temperature of the combination. The greenbody may be formed by pressing the constituent or the combination of constituents using a compression method such as isostatic pressing. The greenbody may be annealed in an inert or oxidizing atmosphere. In some embodiments, the green-body is annealed at a temperature in a range from about 600 degrees Celsius to the melting temperature of the combination. In some instances, the resulting sintered ceramic including the phosphor of formula I is then obtained that includes closely packed, dense sintered particles.

In some embodiments, a lighting apparatus includes a semiconductor light source capable of producing blue light of high power density, that is radiationally coupled to a phosphor wheel including a phosphor of formula I. In some embodiments, the phosphor wheel includes the phosphor of formula I in a monolithic form selected from single crystal and ceramic. In some embodiments, the phosphor wheel includes the phosphor of formula I in a composite form. The semiconductor light source may be a light-emitting diode (LED), a laser diode (LD) or a hybrid of LED and LD. In some embodiments, a blue light flux of the semiconductor light source is higher than 25 W/cm$^2$. In some embodiments, a blue light flux of the semiconductor light source is higher than 40 W/cm$^2$.

Figure 3:
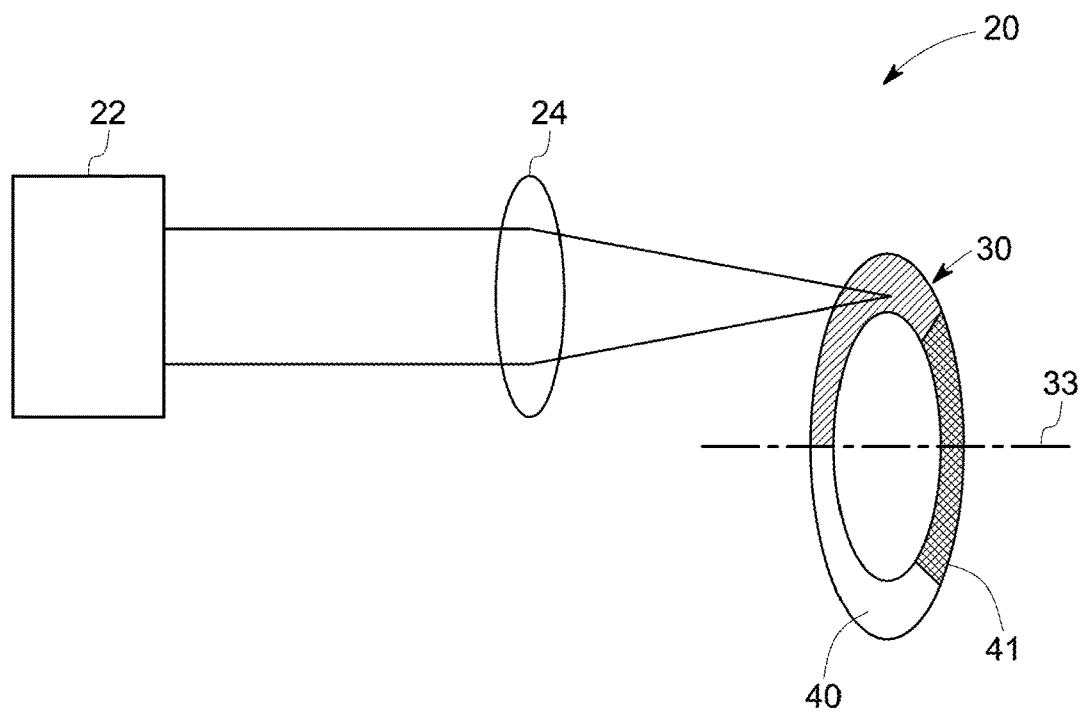
FIG. 3 is a schematic view of a lighting apparatus including a phosphor wheel, in accordance with some embodiments of the present disclosure.

FIG. 3 illustrates a schematic of a lighting apparatus 20, in some embodiments. The lighting apparatus 20 includes a semiconductor light source 22 for example, a LED or a LD, an optical assembly 24 and a phosphor wheel 30. The semiconductor light source 22 is capable of producing blue light of high power density in a wavelength range from about 420 nm to about 480 nm. In some embodiments, the semiconductor light source 22 produces blue light of high power density in a wavelength range from about 440 nm to about 460 nm. The optical assembly 24 includes one or more optical elements such as mirrors, lenses and filters.

A phosphor wheel includes a plurality of spatial segments including at least one spatial segment having a substance that emits a light output characterized by a color or wavelength when the at least one spatial segment is illuminated by a suitable light source. Each spatial segment may include a different phosphor. For example, individual spatial segment produces red or green light. In some embodiments of the present disclosure, the red phosphor may be a phosphor of formula I or a red quantum dot material, and the green phosphor may be a green quantum dot material, a garnet activated with $Ce^{3+}$, β-SiAlON, or a combination thereof. In some embodiments, at least one spatial segment includes the phosphor of formula I in the monolithic form as described above. In some other embodiments, at least one spatial segment includes the phosphor of formula I in a composite form.

Figure 4:
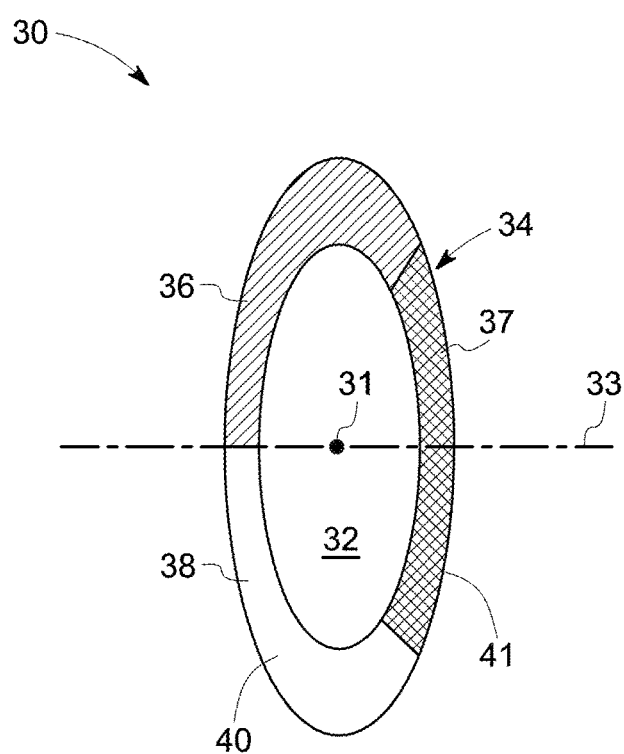
FIG. 4 is a schematic of a phosphor wheel, in accordance with some embodiments of the present disclosure.

FIG. 4 shows a schematic of a phosphor wheel 30, in some embodiments. The phosphor wheel 30 includes a core region 32 and a rim region 34 that is far from the center 31 of the phosphor wheel 30 and concentric with the core region 32. The core region 34 includes a circular metal disk. The rim region 34 may include three concentric spatial segments 36, 37, 38 on a first side 40 of the phosphor wheel 30. At least one spatial segment, for example, the spatial segment 36 includes the phosphor of formula I. In some embodiments, the spatial segment 36 includes the phosphor of formula I in the monolithic form as described above. In some other embodiments, the phosphor of formula I in a composite form as described above. One or both spatial segments (37, 38) may include an additional luminescent material (described below). In some embodiments, at least one spatial segment 37 or 38 may be a transmission segment in the form of a slit. The additional luminescent materials may be included in the one or more spatial segments (37, 38) in form of layers, sheets, plate-like pieces, monolith, composite etc. In some instances, the one or more spatial segments (37, 38) may include materials other than phosphors. For example, the one or more spatial segments (37, 38) may include dichroic filters, absorption filters, interference filters, transparent regions with no color modifying properties, etc. The spatial segments 36, 37, 38 of the phosphor wheel 30 can be of same or different sizes and/or shapes. The phosphor wheel 30 may also include multiple separated spatial segments that have the same phosphor. The phosphor wheel 30 is rotatable about its axis 33 to expose different spatial segments (36, 37, 38) or different portions of the spatial segments of the phosphor wheel 30 to a light from the semiconductor light source 22.

In some embodiments, the composite form of the phosphor of formula I is a glass-phosphor composite. The glass-phosphor composite may be obtained by mixing a glass and the phosphor of formula I, subjecting the mixture to a uniaxial compression so as to have a disc or plate form of the mixture and firing the compressed mixture (disc or plate) up to the melt point of the glass. Suitable glass materials include low melting point glasses as described in JP200739303.

In some embodiments, the composite form of the phosphor of formula I is a polymer-phosphor composite. The polymer-phosphor composite may be obtained by mixing a polymer and the phosphor of formula I to form a slurry, and applying the slurry on the spatial segment 36 of the phosphor wheel 30 to form a layer. Examples of suitable polymers include epoxies, silicones, epoxy-silicones, acrylates and combinations thereof.

Referring to FIG. 3 again, radiation from the semiconductor light source 22 strikes the optical assembly 24 that focuses the radiation onto the first side 40 of the phosphor wheel 30. The light emitted by the phosphor wheel 30 may be directed to a collector (not shown in FIG. 3). The collector may include one or more lenses or other optical elements, for example, projection lenses that collect and transfer the light that exits the phosphor wheel 30, to other components, for example, a screen for display. The phosphor wheel 30 may be rotated about its axis 33 for moving the different spatial segments 36, 37, 38 with respect to the light from the semiconductor light source 22 to produce different color light. An actuator or motor (not shown in figures) can be used to move as well as control the speed of the phosphor wheel 30.

In certain embodiments, the phosphor wheel 30 is illuminated on the first side 40 and light is emitted from a second side 41 and is directed to a collector that is placed in front of the second side 41 of the phosphor wheel 30. In some embodiments, the phosphor wheel 30 is illuminated on the first side 40 and light is emitted from the first side 40 and is reflected to direct it to a collector placed at a suitable position. In some other embodiments, the phosphor wheel 30 can be illuminated on both sides (40, 41).

Although the phosphor wheel 30 shown in FIGS. 3 and 4 includes spatial segments at the rim region 34, a phosphor wheel may have different configurations and may be configured to move in a different manner other than being rotated.

In some embodiments, the phosphor of formula I may be treated as described in U.S. Pat. Nos. 8,252,613 and 8,906,724 to enhance performance and color stability properties prior to or after forming the monolithic form or the composite form as described above. The treatment process includes contacting the phosphor of formula I at an elevated temperature with a fluorine-containing oxidizing agent in gaseous form. In some embodiments, the single crystal of the phosphor of formula I is treated using the treatment process.

Suitable examples of additional luminescent materials for use in a phosphor wheel and/or a lighting apparatus with the phosphor of formula I may include, but are not limited to: $((Sr_{1-z}(Ca, Ba, Mg, Zn)_z)_{1-(x+w)}(Li, Na, K, Rb)_w Ce_x)_3(Al_{1-y}Si_y)O_{4+y+3(x-w)}F_{1-y-3(x-w)}$, $0<x\leq0.10$, $0\leq y\leq0.5$, $0\leq z\leq0.5$, $0\leq w\leq x$; $(Ca, Ce)_3Sc_2Si_3O_{12}(CaSiG)$; $(Sr,Ca,Ba)_3Al_{1-x}Si_xO_{4+x}F_{1-x}:Ce^{3+}(SASOF))$; $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*vB_2O_3:Eu^{2+}$ (wherein $0<v\leq1$); $Sr_2Si_3O_8*2SrCl_2:Eu^{2+}$;$(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+},Mn^{2+}$; $(Ba,Sr,Ca)Al_2O_4:Eu^{2+}$; $(Y,Gd,Lu,Sc,La)BO_3:Ce^{3+},Tb^{3+}$; $ZnS:Cu^+,Cl^-$; $ZnS:Cu^+,Al^{3+}$; $ZnS:Ag^+,Cl^-$; $ZnS:Ag^+,Al^{3+}$; $(Ba,Sr,Ca)_2Si_{1-\xi}O_{4-2\xi}:Eu^{2+}$ (wherein $-0.2\leq\xi\leq0.2$); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Al,Ga)_{5-\alpha}O_{12-3/2\alpha}:Ce^{3+}$ (wherein $0\leq\alpha\leq0.5$); $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_\beta Si_\gamma N_\mu:Eu^{2+}$ (wherein $2\beta+4\gamma=3\mu$); $(Ba,Sr,Ca)_2Si_{5-x}Al_x$ $N_{8-x}O_x$:$Eu^{2+}$ (wherein 0≤x≤2); $Ca_3(SiO_4)Cl_2$:$Eu^{2+}$; (Lu,Sc,Y,Tb)$_{2-u-v}$Ce$_v$Ca$_{1+u}$Li$_w$Mg$_{2-w}$P$_w$(Si,Ge)$_{3-w}$O$_{12-u/2}$ (where 0.5≤u≤1, 0<v≤0.1, and 0≤w≤0.2); (Y,Lu,Gd)$_{2-\varphi}$Ca$_\varphi$Si$_4$N$_{6+\varphi}$C$_{1-\varphi}$:Ce$^{3+}$, (wherein 0≤φ≤0.5); (Lu,Ca,Li,Mg,Y), α-SiAlON doped with Eu$^{2+}$ and/or Ce$^{3+}$; (Ca,Sr,Ba)SiO$_2$N$_2$:Eu$^{2+}$, Ce$^{3+}$; β-SiAlON:Eu$^{2+}$, 3.5MgO*0.5MgF$_2$*GeO$_2$:Mn$^{4+}$; (Sr,Ca,Ba)AlSiN$_3$:Eu$^{2+}$; (Sr,Ca,Ba)$_3$SiO$_5$:Eu$^{2+}$; Ca$_{1-c-f}$Ce$_c$Eu$_f$Al$_{1+c}$Si$_{1-c}$N$_3$, (where 0≤c≤0.2, 0≤f≤0.2); Ca$_{1-h-r}$Ce$_h$Eu$_r$Al$_{1-h}$(Mg,Zn)$_h$SiN$_3$, (where 0≤h≤0.2, 0≤r≤0.2); Ca$_{1-2s-t}$Ce$_s$(Li,Na)$_s$Eu$_t$AlSiN$_3$, (where 0≤s≤0.2, 0≤t≤0.2, s+t>0); and Ca$_{1-\sigma-\chi-\phi}$Ce$_\sigma$ (Li,Na)$_\chi$Eu$_\phi$Al$_{1+\sigma-\chi}$Si$_{1-\sigma+\chi}$N$_3$, (where 0≤σ≤0.2, 0≤χ≤0.4, 0≤φ≤0.2).

In some particular embodiments, the additional luminescent material includes a green-emitting material such as a garnet activated with Ce$^{3+}$, β-SiAlON, or a combination thereof.

In some embodiments, the additional luminescent material includes a green light emitting quantum dot (QD) material. The green light emitting QD material may include a group II-VI compound, a group III-V compound, a group IV-IV compound, a group IV compound, a group I-III-VI$_2$ compound, or a mixture thereof. Non-limiting examples of group II-VI compounds include CdSe, CdTe, CdS, ZnSe, ZnTe, ZnS, HgTe, HgS, HgSe, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, or combinations thereof. Group III-V compounds may be selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, InAlPAs, and combinations thereof. Examples of group IV compounds include Si, Ge, SiC, and SiGe. Examples of group I-III-VI$_2$ chalcopyrite-type compounds include CuInS$_2$, CuInSe$_2$, CuGaS$_2$, CuGaSe$_2$, AgInS$_2$, AgInSe$_2$, AgGaS$_2$, AgGaSe$_2$ and combinations thereof.

QD materials for use as the additional luminescent material may be a core/shell QD, including a core, at least one shell coated on the core, and an outer coating including one or more ligands, preferably organic polymeric ligands. Exemplary materials for preparing core-shell QDs include, but are not limited to, Si, Ge, Sn, Se, Te, B, C (including diamond), P, Co, Au, BN, BP, BAs, AlN, AlP, AlAs, AlSb, GaN, GaP, GaAs, GaSb, InN, InP, InAs, InSb, AlN, AlP, AlAs, AlSb, GaN, GaP, GaAs, GaSb, ZnO, ZnS, ZnSe, ZnTe, CdS, CdSe, CdSeZn, CdTe, HgS, HgSe, HgTe, BeS, BeSe, BeTe, MgS, MgSe, MnS, MnSe, GeS, GeSe, GeTe, SnS, SnSe, SnTe, PbO, PbS, PbSe, PbTe, CuF, CuCl, CuBr, CuI, Si$_3$N$_4$, Ge$_3$N$_4$, Al$_2$O$_3$, (Al, Ga, In)$_2$ (S, Se, Te)$_3$, Al$_2$CO, and appropriate combinations of two or more such materials. Exemplary core-shell QDs include, but are not limited to, CdSe/ZnS, CdSe/CdS, CdSe/CdS/ZnS, CdSeZn/CdS/ZnS, CdSeZn/ZnS, InP/ZnS, PbSe/PbS, PbSe/PbS, CdTe/CdS, and CdTe/ZnS.

The QD materials typically include ligands conjugated to, cooperated with, associated with, or attached to their surface. In particular, the QDs may include a coating layer comprising ligands to protect the QDs from environmental conditions including elevated temperatures, high intensity light, external gasses, and moisture, control aggregation, and allow for dispersion of the QDs in the host binder material.

The ratio of each of the individual luminescent materials, for example phosphor of formula I and the additional luminescent materials may vary depending on the characteristics of the desired resulting light output. The relative proportions of the individual luminescent materials in the lighting apparatus or the phosphor wheel may be adjusted such that when emissions of the individual luminescent materials are blended, and employed in a lighting apparatus, visible light of predetermined x and y values is produced on the chromaticity diagram created by the International Commission on Illumination (CIE). In certain embodiments, the lighting apparatus emits white light. The exact identity and amount of each luminescent material in a lighting apparatus as described herein can be varied according to the needs of the end user.

The lighting apparatus and/or backlight apparatus of the present invention may be used for general illumination and display applications. Examples include chromatic lamps, plasma screens, xenon excitation lamps, UV excitation marking systems, automotive headlamps, home and theatre projectors, laser pumped devices, point sensors, liquid crystal display backlight units, televisions, computer monitors, smartphones, tablet computers and other handheld devices that have a display including a semiconductor light source as described herein. The list of these applications is meant to be merely exemplary and not exhaustive.

EXAMPLES

The examples that follow are merely illustrative, and should not be construed to be any sort of limitation on the scope of the claimed invention.

Example 1

Procedure to Form K$_2$(Si, Mn)F$_6$ in Single Crystal Form

A mixture of K$_2$SiF$_6$ (40 mol %) and KBr (60 mol %) was weighed in glove box. The mixture (1 gram) was put in a platinum crucible and transferred to a mullite tube furnace. The tube furnace was purged with Ar atmosphere for 30 minutes followed by firing at 675 degrees Celsius for a 1 hour hold, (3 degrees Celsius up and down/Ar bubbled through KOH). The resulting melt was purged for 30 minutes in Ar atmosphere. The platinum crucible, which contained the melt, was taken out of the furnace and washed in methanol to dissolve excess KBr. It was observed that the bubbler looked clean confirming no or minimal formation of SiF$_4$ due to the decomposition of K$_2$SiF$_6$.

The washed melt was examined using X-ray diffraction (XRD). XRD results showed that the melt had the desired phase K$_2$SiF$_6$. This indicates that a single crystal of phase K$_2$SiF$_6$ can be grown if the melt point is suppressed to prevent decomposition of K$_2$SiF$_6$ into 2KF and SiF$_4$. Using a similar procedure, K$_2$(Si, Mn)F$_6$ can be grown in single crystal using either K$_2$(Si,Mn)F$_6$ or K$_2$SiF$_6$ and a Mn compound in the starting mixture.

Example 2

Procedure to Form K$_2$(Si, Mn)F$_6$ in Sintered Ceramic Form

Sintered ceramic parts of K$_2$(Si, Mn)F$_6$ can be formed via HIP (Hot isostatic pressing) of the starting materials and/or by making a greenbody with further sintering to produce a transparent or translucent ceramic part. In the process, particle size may be well controlled and small amounts of flux material may be added to improve sintering and densification.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A lighting apparatus comprising:
a semiconductor light source capable of producing blue light of high power density, the semiconductor light source radiationally coupled to a phosphor of formula I in a monolithic single crystal form;

$$A_x(M,Mn)F_y \qquad (I)$$

wherein A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of an [$MF_y$] ion; and y is 5, 6, or 7.

2. The lighting apparatus according to claim 1, wherein A is Na, K, Rb, Cs, or a combination thereof; M is Si, Ge, Ti, or a combination thereof; and y is 6.

3. The lighting apparatus according to claim 1, wherein A is K and M is Si.

4. The lighting apparatus according to claim 1, wherein the phosphor of formula I in the monolithic single crystal form is disposed on a phosphor wheel.

5. The lighting apparatus according to claim 1, comprising an automotive headlamp.

6. A backlight apparatus comprising:
a semiconductor light source capable of producing blue light of high power density, the semiconductor light source radiationally coupled to a phosphor of formula I in a monolithic single crystal form;

$$A_x(M,Mn)F_y \qquad (I)$$

wherein A is Li, Na, K, Rb, Cs, or a combination thereof, M is Si, Ge, Sn, Ti, Zr, Al, Ga, In, Sc, Hf, Y, La, Nb, Ta, Bi, Gd, or a combination thereof, x is an absolute value of a charge of an [$MF_y$] ion; and y is 5, 6, or 7.

7. The backlight apparatus according to claim 6, comprising a television.

* * * * *